(12) United States Patent
Kaneko

(10) Patent No.: US 8,199,555 B2
(45) Date of Patent: Jun. 12, 2012

(54) NONVOLATILE LOGIC CIRCUIT AND A METHOD FOR OPERATING THE SAME AS AN EXCLUSIVE-OR (XOR) CIRCUIT

(75) Inventor: Yukihiro Kaneko, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/222,782

(22) Filed: Aug. 31, 2011

(65) Prior Publication Data

US 2011/0309860 A1 Dec. 22, 2011

Related U.S. Application Data

(63) Continuation of application No. PCT/JP2011/000801, filed on Feb. 14, 2011.

(30) Foreign Application Priority Data

Mar. 10, 2010 (JP) ................................ 2010-052665

(51) Int. Cl.
*G11C 11/22* (2006.01)
(52) U.S. Cl. .......... 365/145; 365/65; 365/117; 365/164; 365/171; 326/38
(58) Field of Classification Search ............... 365/65, 365/117, 145, 164, 171
See application file for complete search history.

(56) References Cited

U.S. PATENT DOCUMENTS

| 8,023,309 B2 * | 9/2011 | Tanaka et al. ................. 365/145 |
| 2006/0114018 A1 | 6/2006 | Sugahara et al. |
| 2009/0097299 A1 | 4/2009 | Tanaka et al. |
| 2011/0299318 A1 * | 12/2011 | Kaneko et al. ................ 365/145 |
| 2011/0299566 A1 * | 12/2011 | Ueda et al. ..................... 374/177 |

FOREIGN PATENT DOCUMENTS

| JP | 2009-099606 | 5/2009 |
| WO | WO 2004/086625 A1 | 10/2004 |

* cited by examiner

*Primary Examiner* — Fernando Hidalgo
(74) *Attorney, Agent, or Firm* — McDermott Will & Emery LLP

(57) ABSTRACT

A non-volatile logic circuit includes a control electrode, a ferroelectric layer disposed on the control electrode, a semiconductor layer disposed on the ferroelectric layer, a power electrode and an output electrode disposed on the semiconductor layer, and first to fourth input electrodes disposed on the semiconductor layer. The first and second input electrodes receive first and second inputs, respectively. The third and fourth input electrodes receive inversion signals of the second and first input signal, respectively. A resistance value of the semiconductor layer between the power electrode and the output electrode varies according to the first input signal and the second input signal so that an exclusive-OR signal of the first and second input signals is output from the output electrode.

4 Claims, 10 Drawing Sheets

| First Input Signal | Second Input Signal | Output |
|---|---|---|
| 1 | 1 | 0 |
| 0 | 1 | 1 |
| 1 | 0 | 1 |
| 0 | 0 | 0 |

Fig. 4

| | Input Electrodes | | | | Output resistance |
|---|---|---|---|---|---|
| | 17a | 17b | 17c | 17d | |
| First State | -10 | -10 | 10 | 10 | High |
| Second State | 10 | -10 | 10 | -10 | Low |
| Third State | -10 | 10 | -10 | 10 | Low |
| Fourth State | 10 | 10 | -10 | -10 | High |

Unit: Volt

| | Output Resistance (MΩ) |
|---|---|
| First State | 221.4 |
| Second State | 0.6479 |
| Third State | 0.6521 |
| Fourth State | 791.6 |

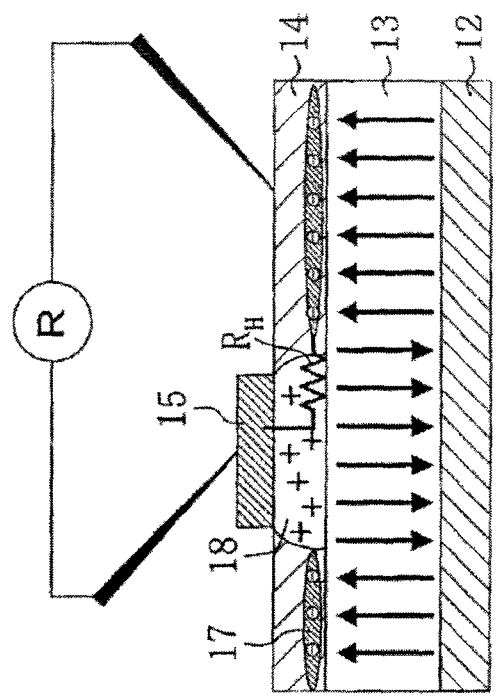
Fig.11A
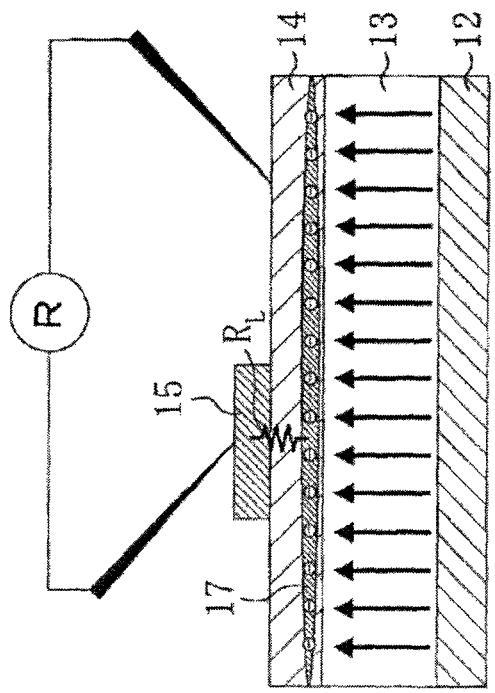
Fig.11B
Fig.11C
| Resistance value between semiconductor layer and second electrode (conduction state) | (a) Low resistance (short-circuited) ($R_L < 10^3$ ohm per square) | (b) High resistance (open-circuited) ($R_H > 10^6$ ohm per square) |
|---|---|---|
| Holding state | First state | Second state |

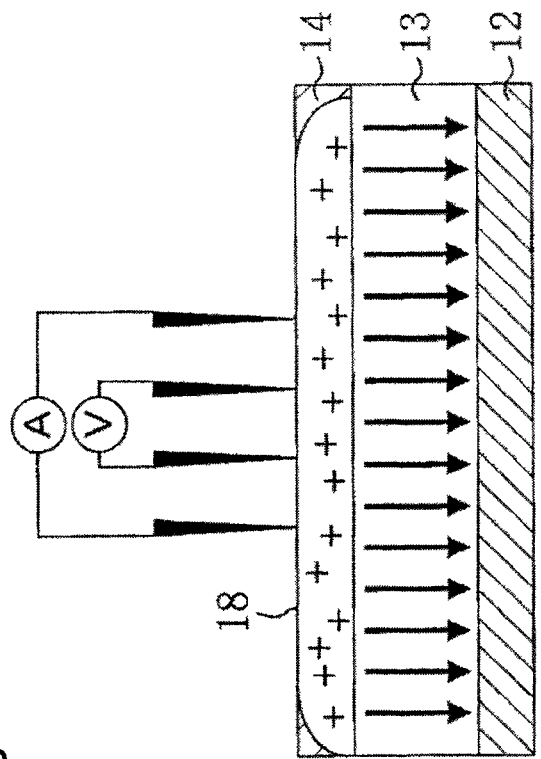
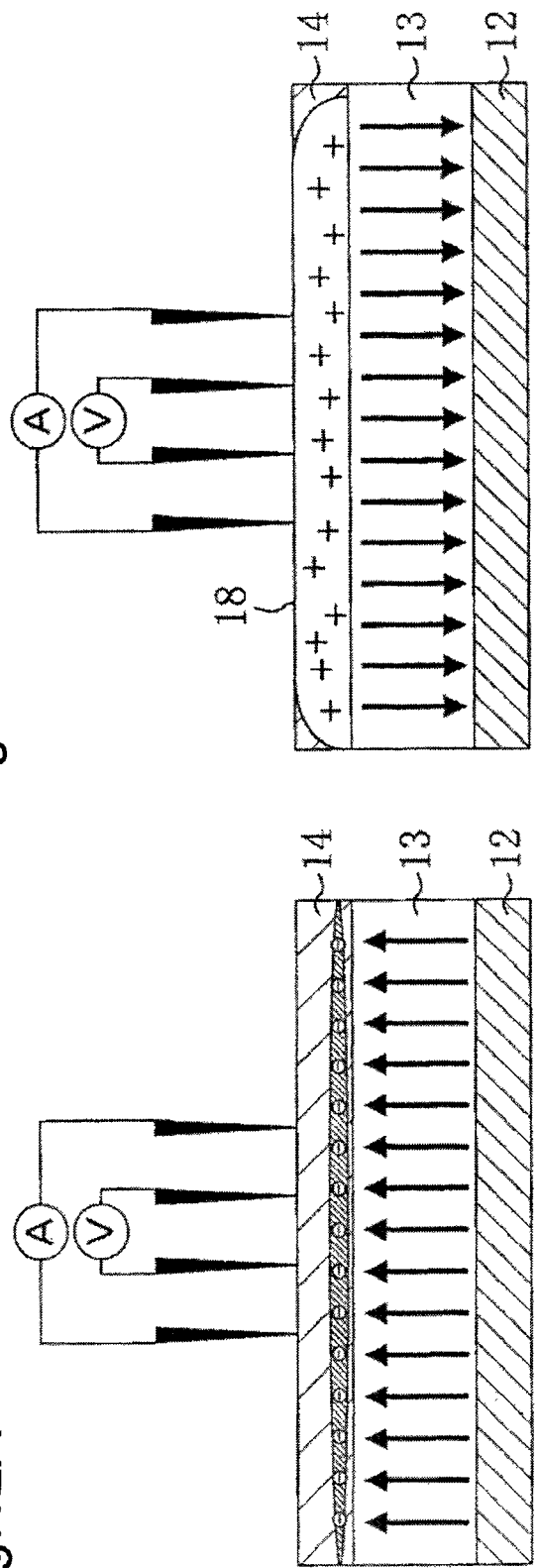

US 8,199,555 B2

NONVOLATILE LOGIC CIRCUIT AND A METHOD FOR OPERATING THE SAME AS AN EXCLUSIVE-OR (XOR) CIRCUIT

This is a continuation of International Application No. PCT/JP2011/000801, with an international filing date of Feb. 14, 2011, which claims priority of Japanese Patent Application No. 2010-052665, filed on Mar. 10, 2010, the contents of which are hereby incorporated by reference.

BACKGROUND OF THE INVENTION

1. Field of the Invention

The present disclosure relates to a non-volatile logic circuit and a method for operating the nonvolatile logic circuit as an exclusive-OR (XOR) circuit.

2. Description of the Related Art

FIG. 8 to FIG. 12C are reproductions of FIG. 1 to FIG. 5 of United States Pre-Grant Patent Application Publication No. 2009/0097299 (Hereinafter, Patent Document 1), which corresponds to Japanese Laid-Open patent publication No. 2009-099606.

As shown in FIG. 8, a semiconductor memory device 10 according to Patent Document 1 includes a stacked layer of a ferroelectric layer 13 and a semiconductor layer 14. In the semiconductor memory device 10, a first electrode 12 is formed on the stacking layer at the ferroelectric layer 13 side and a plurality of second electrodes 15a, 15b and 15c are formed on the stacked layer at the semiconductor layer 14 side. These layers are formed on a substrate 1.

FIGS. 9A and 9B show an initial state of the semiconductor memory device 10. FIG. 9A is a cross-sectional perspective view and FIG. 9B is an equivalent circuit diagram.

For example, when an n-type semiconductor material is used for the semiconductor layer 14, all polarizations 16 are oriented in the same direction so that the polarizations 16 of the ferroelectric layer 13 are coupled with electrons (majority carriers) of the semiconductor layer 14 in an initial state. In this case, two-dimensional electrons 17 induced by polarization in the ferroelectric layer 13 are accumulated around an interface between the semiconductor layer 14 and the ferroelectric layer 13, and the semiconductor layer 14 is in a low resistance state. Thus, the semiconductor layer 14 serves as a channel in which a current flows in the same manner as a metal electrode and can be used as a uniform electrode as a metal electrode. In such a case, as shown in FIG. 9B, a conduction state between the semiconductor layer 14 and each of the second electrodes 15a, 15b and 15c is short-circuited.

In this state, as shown in FIG. 10A, when a bias voltage relatively high to the first electrode 12 is applied to the second electrode 15c to invert the polarization only in part of the ferroelectric layer 13 located in which the second electrode 15c is formed, the polarization 16 is oriented in a direction which causes deletion of electrons in the semiconductor layer 14. Accordingly, only the part 18 of the semiconductor layer 14 located in the region in which the second electrode 15c is formed is depleted and thus becomes in a high resistance state. As a result, as shown in FIG. 10B, a state between the semiconductor layer 14 and the second electrode 15c is an open-circuit state.

FIGS. 11A, 11B and 11C show two resistance states of part of the semiconductor layer 14 located in a region in which a second electrode 15 is formed. FIG. 11A is a cross-sectional view of the part when it is in a low resistance state, FIG. 11B is a cross-sectional view of the part when it is in a high resistance state, and FIG. 11C is a table showing sheet resistance values between the semiconductor layer 14 and the second electrode 15. As shown in the table, each of the parts 18 of the semiconductor layer 14 located in regions in which the second electrode 15 is formed can be in either of two states having different sheet resistance values because of the polarization assist effect of the ferroelectric layer 13.

In the state shown in FIG. 11B, a bias voltage relatively low to the first electrode 12 is applied to the second electrode 15 to invert again the polarization of the ferroelectric layer 13. Thus, the polarization is oriented in the direction in which electrons are accumulated and the part 18 of the semiconductor layer 14 located in the region in which the second electrode 15 is formed is back to a low resistance state. As a result, the conduction state between the semiconductor layer 14 and the second electrode 15 becomes in a short circuit state again.

FIGS. 12A, 12B and 12C show results of measurement for resistance values of the semiconductor layer 14 using a four-probe method. FIG. 12A is a diagram illustrating how the resistance value of the semiconductor layer 14 is measured when it is in a low resistance state where two-dimensional electrons are accumulated, FIG. 12B is a diagram illustrating how the resistance value of the semiconductor layer 14 is measured when it is in a high resistance state where two-dimensional electrons are depleted, and FIG. 11C is a table showing respective measurement results. As shown in the table of FIG. 11C, the resistance value of the semiconductor layer 14 is about $1 \times 10^3$ ohm per square or less in a low resistance state and about $1 \times 10^6$ ohm per square or more in a high resistance state.

The above description is cited from paragraphs [0057] and [0062]-[0067] of US Pre-Grant Patent Application Publication No. 2009/0097299, which corresponds to paragraphs [0028] and [0033]-[0038] of Japanese Laid-Open patent publication No. 2009-099606.

SUMMARY OF THE INVENTION

The purpose of the present disclosure is to provide a novel method for operating a nonvolatile logic circuit as an exclusive-OR (XOR) circuit, utilizing the change of resistance states as shown in FIG. 8 to FIG. 12C.

The method of operating a non-volatile logic circuit of the present invention includes the steps of: a step (a) of preparing the non-volatile logic circuit (20), the non-volatile logic circuit comprising:

a control electrode;

a ferroelectric layer;

a semiconductor layer, and an electrode group, wherein:

the control electrode, the ferroelectric layer, the semiconductor layer, and the electrode group are stacked in this order, the electrode group comprises an electric current source electrode, an output electrode, a first input electrode, a second input electrode, a third input electrode, and a fourth input electrode, an X-direction, a Y-direction, and a Z-direction denote a longitudinal direction of the ferroelectric layer, a direction orthogonal to the longitudinal direction, and a lamination direction, respectively, the first input electrode, the second input electrode, the third input electrode, and the fourth input electrode are interposed between the electric current source electrode and the output electrode, the first input electrode is interposed between the electric current source electrode and the third input electrode along the X-direction, the third input electrode is interposed between the first input electrode and the output electrode along the X-direction, the second input electrode is interposed between the electric current source electrode and the fourth input electrode along the X-direction, the fourth input electrode is interposed between the second input electrode and the output electrode along the X-direction, the first input electrode is adjacent to the second input electrode along the Y-direction, and the third input electrode is adjacent to the fourth input electrode along the Y-direction;

a step (b) of writing one state selected from the group consisting of first, second, third, and fourth states into the non-volatile logic circuit, wherein:

V1, Va, Vb, Vc, and Vd are voltages applied to the control electrode, the first input electrode, the second input electrode, the third input electrode, and the fourth input electrode, respectively, when the first state is written, voltages, which satisfy the following relationship (I), are applied, $$V1>Va, V1>Vb, V1<Vc, \text{ and } V1<Vd \quad (I),$$

when the second state is written, voltages, which satisfy the following relationship (II), are applied, $$V1<Va, V1>Vb, V1<Vc, \text{ and } V1>Vd \quad (II),$$

when the third state is written, voltages, which satisfy the following relationship (III), are applied, $$V1>Va, V1<Vb, V1>Vc, \text{ and } V1<Vd \quad (III),$$

when the fourth state is written, voltages, which satisfy the following relationship (IV), are applied, $$V1<Va, V1<Vb, V1>Vc, \text{ and } V1>Vd \quad (IV),$$

the first and fourth states are high resistant states, and
the second and third states are low resistant states; and
a step (c) of measuring a current generated by applying a voltage between the source electrode and the output electrode to determine whether the state written in the non-volatile logic circuit is the high or low resistant state on the basis of the current.

One embodiment further includes, between the step (a) and the step (b), a step (d) of applying a voltage Vin to the first, second, third, and fourth input electrodes and a voltage Vreset, where Vreset>Vin, to the control electrode to reset the non-volatile logic circuit.

In one embodiment, in the step (b), a first input signal which is either true or false is input to the first input electrode, a second input signal which is either true or false is input to the second input electrode, an inversion signal of the second input signal is input to the third input electrode, an inversion signal of the first input signal is input to the fourth input electrode, and the high and low resistant states correspond respectively to false and true of exclusive OR on the basis of the first and second input signals.

One embodiment further includes, between the step (b) and the step (c), a step of (e) of turning off power supplied to the non-volatile logic circuit.

A non-volatile logic circuit of the present invention, includes:

a control electrode;
a ferroelectric layer disposed on the control electrode;
a semiconductor layer disposed on the ferroelectric layer;
a power electrode disposed on the semiconductor layer;

an output electrode disposed on the semiconductor layer;
a first input electrode, disposed on the semiconductor layer, for receiving a first input signal;
a second input electrode, disposed on the semiconductor layer, for receiving a second input signal;
a third input electrode, disposed on the semiconductor layer, for receiving an inversion signal of the second input signal; and
a fourth input electrode, disposed on the semiconductor layer, for receiving an inversion signal of the first input signal, wherein:

in a plan view, the first to fourth input electrodes are arranged in a matrix between the power electrode and the output electrode so that the first and third electrodes are aligned along a first direction from the power electrode to the output electrode, the second and fourth electrodes are aligned along the first direction, the first and second electrodes are aligned along a second direction perpendicular to the first direction, and the third and fourth electrode are aligned along the second direction.

In one embodiment, a resistance value of the semiconductor layer between the power electrode and the output electrode varies according to the first input signal and the second input signal.

In one embodiment, the first input signal and the second input signal change polarization directions of the ferroelectric layer below respective first to fourth input electrodes.

In one embodiment, the non-volatile logic circuit is configured so that: voltages V1, Va, Vb, Vc and Vd are applied to the control electrode, the first input electrode, the second input electrode, the third input electrode and the fourth input electrode, respectively, first, second, third and fourth states are written into the non-volatile logic circuit, when the first state is written, voltages, which satisfy V1>Va, V1>Vb, V1<Vc, and V1<Vd, are applied, when the second state is written, voltages, which satisfy V1<Va, V1>Vb, V1<Vc, and V1>Vd, are applied, when the third state is written, voltages, which satisfy V1>Va, V1<Vb, V1>Vc, and V1<Vd, are applied, and when the fourth state is written, voltages, which satisfy V1<Va, V1<Vb, V1>Vc, and V1>Vd, are applied.

In one embodiment, the non-volatile logic circuit is configured to be reset by applying a voltage Vin to the first, second, third, and fourth input electrodes and a voltage Vreset, where Vreset>Vin, to the control electrode.

In one embodiment, the non-volatile logic circuit is configured so that an exclusive-OR signal of the first and second input signals is output from the output electrode.

In one embodiment, the ferroelectric layer comprises $Pb(Zr,Ti)O_3$, $Sr(Bi,Ta)O_x$ or $BiTiO_x$.

In one embodiment, the semiconductor layer comprises ZnO, GaN or $InGaZnO_x$.

The present subject matter provides a non-volatile logic circuit and a method for operating the nonvolatile logic circuit as an exclusive-OR (XOR) circuit.

Other features, elements, processes, steps, characteristics and advantages of the present disclosure will become more apparent from the following detailed description of preferred embodiments of the present disclosure with reference to the attached drawings.

BRIEF DESCRIPTION OF THE DRAWINGS

FIG. 4 is an exemplary diagram showing the voltages of the input electrode 17a to 17d on writing.

FIGS. 11A, 11B and 11C are reproductions of FIG. 4 of Patent Document 1.

FIGS. 12A, 12B and 12C are reproductions of FIG. 5 of Patent Document 1.

DETAILED DESCRIPTION OF PREFERRED EMBODIMENTS

The embodiment of the present disclosure is described below with reference to the drawings.

Embodiment 1

Figure 1A:
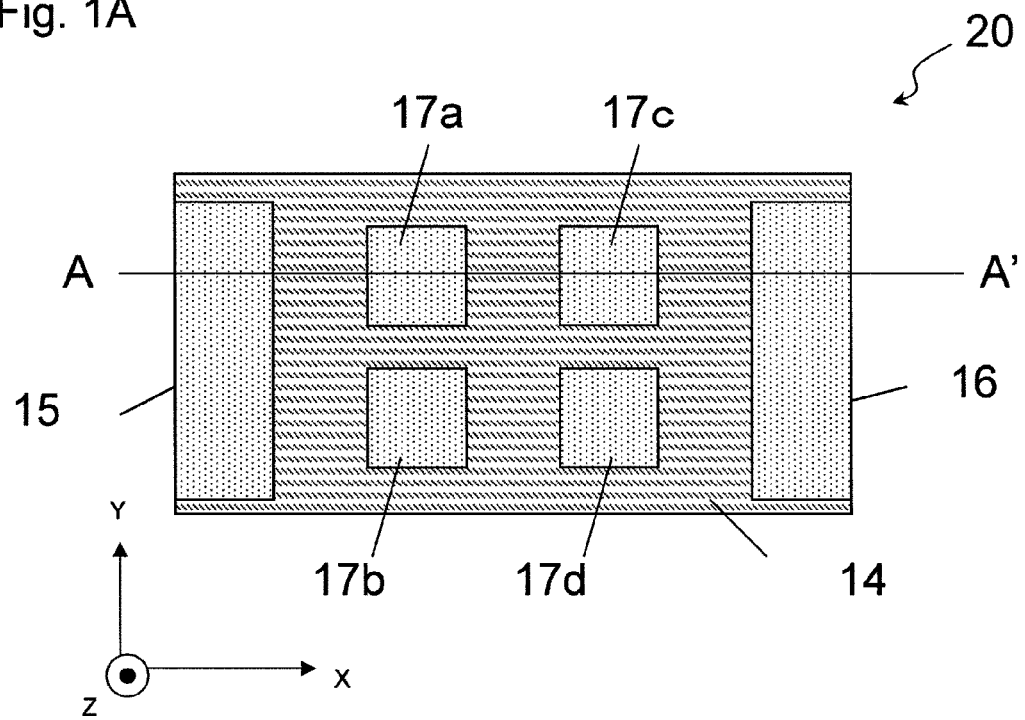
FIG. 1A shows an exemplary top view of the nonvolatile logic circuit according to the embodiment 1.
Figure 1B:
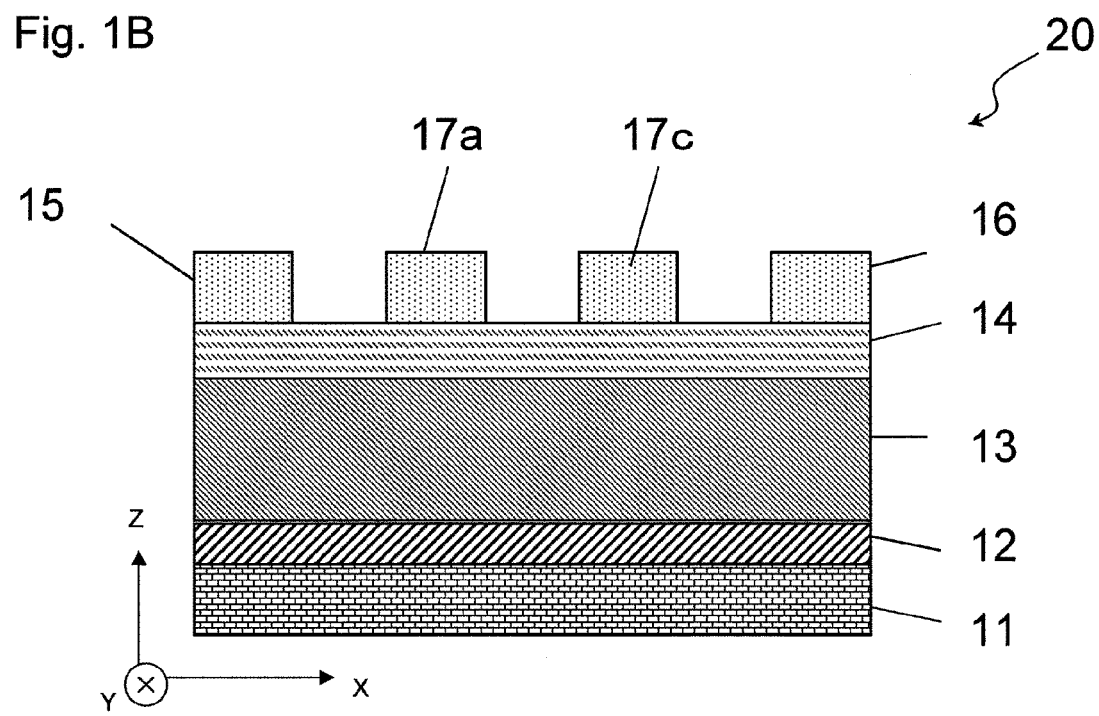
FIG. 1B shows the cross-sectional view of A-A' in FIG. 1A.

FIG. 1A shows a top view of the nonvolatile logic circuit according to the embodiment 1. FIG. 1B shows a cross-sectional view of A-A'.

As shown in FIG. 1A and FIG. 1B, on a substrate 1, a control electrode 12, a ferroelectric film 13, a semiconductor film 14, and an electrode group are formed. The control electrode 13, the ferroelectric film 13, the semiconductor film 14, and the electrode group are stacked on the substrate 1 in this order.

The electrode group comprises a power electrode 15, an output electrode 16, a first input electrode 17a, a second input electrode 17b, a third input electrode 17c, and a fourth input electrode 17d.

The disposition relationship of the input electrodes 17a to 17d is described below in more detail.

As shown in FIG. 1A and FIG. 1B, ax X direction, a Y-direction, and a Z-direction denote the longitudinal direction of the ferroelectric film 13, the direction orthogonal to the longitudinal direction, and the stack direction, respectively.

The first input electrode 17a, the second input electrode 17b, the third input electrode 17c, and the fourth input electrode 17d are interposed between the power electrode 15 and the output electrode 16.

Along the X-direction, the first electrode 17a is interposed between the power electrode 15 and the third electrode 17c. The third electrode 17c is interposed between the first electrode 17a and the output electrode 16. The second input electrode 17b is interposed between the power electrode 15 and the fourth input electrode 17d. The fourth input electrode 17d is interposed between the second input electrode 17b and the output electrode 16.

Along the Y-direction, the first input electrode 17a is adjacent to the second input electrode 17b. The third input electrode 17c is adjacent to the fourth input electrode 17d.

In the non-volatile logic circuit 20, the current through the semiconductor film 14 is controlled depending on the direction of the polarization of the ferroelectric film 13. Namely, when the polarization of the ferroelectric film 13 corresponds to the +Z direction, the electrons induced in the semiconductor film 14 cause the semiconductor film 14 to have low resistance. On the contrary, when polarization of the ferroelectric film 13 corresponds to the −Z direction, the electrons driven away from the semiconductor film 14 cause the semiconductor film 14 to have high resistance.

Voltages applied between the input electrodes 17a-17d and the control electrode 12 determine the resistance value of the semiconductor film 14, thereby changing the resistance value between the power electrode 15 and the output electrode 16.

Figures 2, 3:
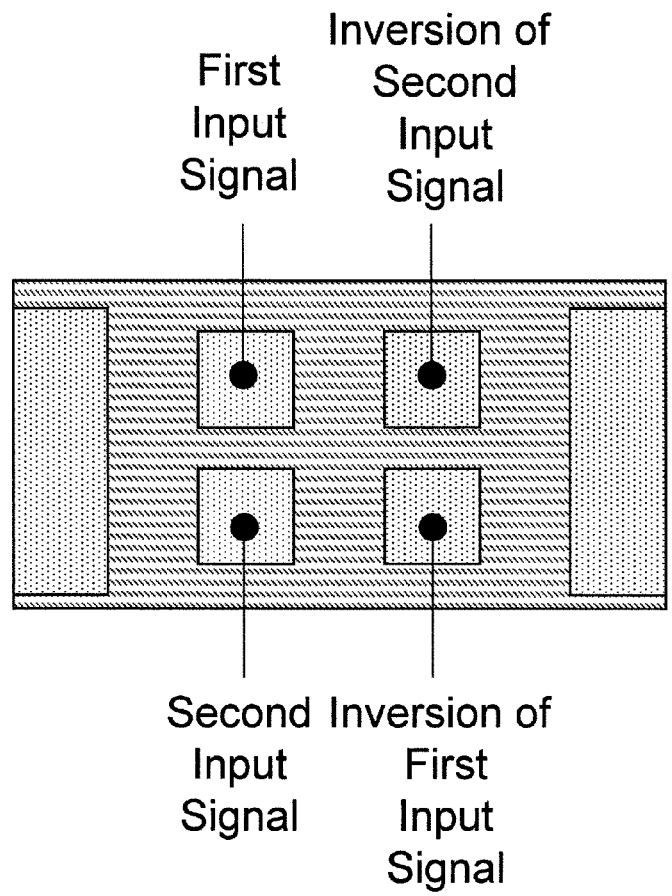
FIG. 2 shows an example of the relationship between the input electrodes 17a-17d and the first and second input signals in the embodiment 1.
FIG. 3 shows an example of the table of truth value in the embodiment 1.

The nonvolatile logic circuit 20 performs an exclusive-OR (XOR) operation of two inputs—one output. As shown in FIG. 2, a first input signal, a second input signal, an inversion signal of the second input signal, an inversion signal of the first input signal are input to the first input electrode 17a, the second input electrode 17b, the third input electrode 17c, and the fourth input electrode 17d, respectively. On the basis of the table of truth value shown in FIG. 3, the execution result of the exclusive-OR (XOR) operation is output.

(Writing of Data into the Nonvolatile Logic Circuit 20)

Next, writing of data into the nonvolatile logic circuit 20 is described with reference to FIG. 4 to FIG. 6.

FIG. 4 shows the voltages applied to the input electrodes 17a to 17d on data writing. The voltage of, for example, −10V is input as "1" as shown in FIG. 3. The voltage of, for example, 10V is input as "0". The voltage of the control electrode 12 is maintained to be constant, preferably 0V.

Figure 5A:
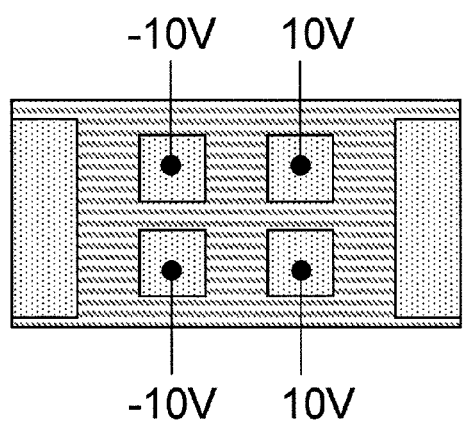
FIG. 5A shows an exemplary top view of the input electrodes 17a to 17d in the first state.

FIG. 5A shows an exemplary top view of the input electrodes 17a to 17d in the first state.

Figure 5B:
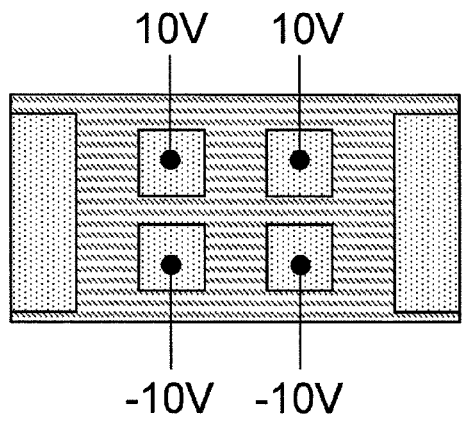
FIG. 5B shows an exemplary top view of the input electrodes 17a to 17d in the second state.

FIG. 5B shows an exemplary top view of the input electrodes 17a to 17d in the second state.

Figure 5C:
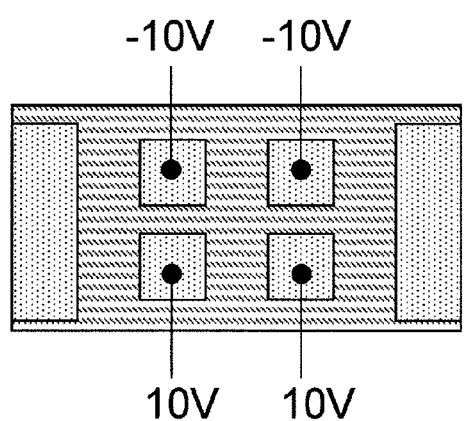
FIG. 5C shows an exemplary top view of the input electrodes 17a to 17d in the third state.

FIG. 5C shows an exemplary top view of the input electrodes 17a to 17d in the third state.

Figure 5D:
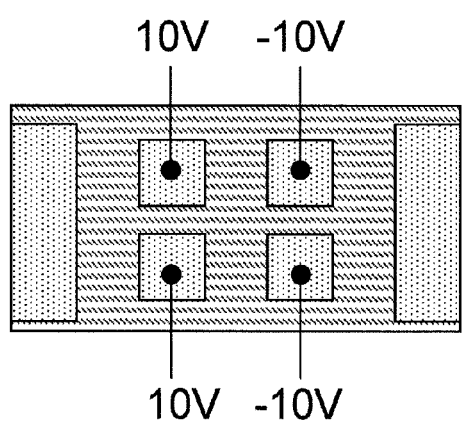
FIG. 5D shows an exemplary top view of the input electrodes 17a to 17d in the fourth state.

FIG. 5D shows an exemplary top view of the input electrodes 17a to 17d in the fourth state.

Figure 6:
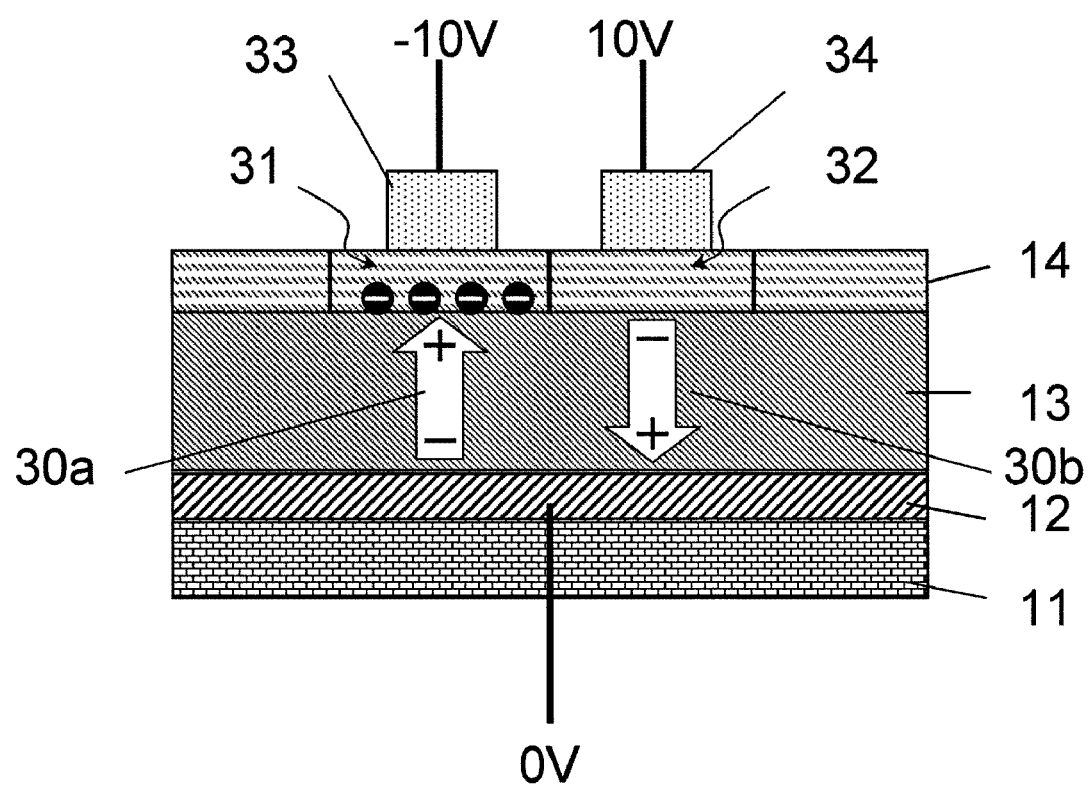
FIG. 6 shows an example of the polarization state of the ferroelectric film 13 and the state of the semiconductor film 14 when the −10V and 10V are applied to the input electrodes 17a to 17d.

FIG. 6 shows the polarization state of the ferroelectric film 13 and the state of the semiconductor film 14 when −10 V and 10 V are applied to the input electrodes 17a to 17d, respectively. The portion 31 of the semiconductor 14 located below the input electrode 33 to which −10V is applied has low resistance because of accumulation of the electrons generated by polarization 30a of the ferroelectric film 13. The portion 32 of the semiconductor 14 located below the input electrode 33 to which 10V is applied has high resistance because of drain of the electrons caused by polarization 30b of the ferroelectric film 13 opposite to the polarization 30a.

The procedures of the first, second, third, and fourth state are described below.

Preferably, a reset operation is executed before the writing operation. In the reset operation, a voltage Vin is applied to the input electrodes 17a-17d, and a voltage Vreset, which satisfies Vin<Vreset, is applied to the control electrode 12. Specifically, it is preferred that 0 volt is applied to the input electrodes 17a-17d while +10 volt is applied to the control electrode 12. Thus, all of the polarization in the ferroelectric film 13 is configured to be upward.

The reset operation allows the nonvolatile logic circuit 20 to be operated with high reproducibility.

In the writing operation, V1, Va, Vb, Vc, and Vd are applied to the control electrode 12, the first input electrode 17a, the second input electrode 17b, the third input electrode 17c, and the fourth input electrode 17d, respectively, to selectively polarize the respective portions of the ferroelectric film 13 located below the respective input electrodes 17a to 17d. The polarization causes the respective portions of the semiconductor film 14 located below the respective input electrodes 17a to 17d to have high or low resistance.

One state selected from the first to fourth states is written into the nonvolatile logic circuit 20.

When the first state is written, the voltages V1, Va, Vb, Vc, and Vd, which satisfy the following relationship, are applied.

$$V1>Va, V1>Vb, V1<Vc, \text{ and } V1<Vd \quad (I)$$

Specifically, while V1 is maintained to be 0 volt, Va of −10V, Vb of −10V, Vc of +10V, Vd of +10V are applied.

When −10V and +10V correspond to true(1) or false(0) respectively, true(1), true(1), false(0), and false(0) are input to the first to fourth input electrodes 17a-17d respectively in the first state.

When the second state is written, the voltages V1, Va, Vb, Vc, and Vd, which satisfy the following relationship, are applied.

$$V1<Va, V1>Vb, V1<Vc, \text{ and } V1>Vd \quad (II)$$

Specifically, while V1 is maintained to be 0 volt, Va of +10V, Vb of −10V, Vc of +10V, Vd of −10V are applied.

In the second state, false(0), true(1), false(0), and true(1) are input to the first to fourth input electrodes 17a-17d, respectively.

When the third state is written, the voltages V1, Va, Vb, Vc, and Vd, which satisfy the following relationship are applied.

$$V1>Va, V1<Vb, V1>Vc, \text{ and } V1<Vd \quad (III)$$

Specifically, while V1 is maintained to be 0 volt, Va of −10V, Vb of +10V, Vc of −10V, Vd of +10V are applied.

In the third state, true(1), false(0), true(1), and false(0) are input to the first to fourth input electrodes 17a-17d, respectively.

When the fourth state is written, the voltages V1, Va, Vb, Vc, and Vd, which satisfy the following relationship are applied.

$$V1<Va, V1<Vb, V1>Vc, \text{ and } V1>Vd \quad (IV)$$

Specifically, while V1 is maintained to be 0 volt, Va of +10V, Vb of −10V, Vc of −10V, Vd of +10V are applied.

In the fourth state, false(0), false(0), true(1), and true(1) are input to the first to fourth input electrodes 17a-17d, respectively.

In the first and fourth states, the resistance between the source electrode 15 and the output electrode 16 is high. In the second and third states, the resistance between the source electrode 15 and the output electrode 16 is low.

As understood from the relationship of true(1) and false(0) input in the first to fourth states, the first input signal, which is true or false, is input to the first input electrode 17a. The second input signal, which is true or false, is input to the second input electrode 17b. the inversion of the second signal is input to the third input electrode 17c. The inversion of the first input electrode 17d is input to the fourth input electrode 17d.

(Reading from the Nonvolatile Logic Circuit 20)

An example of the reading from the nonvolatile logic circuit 20 is described below.

In reading operation, while 0V is applied to the control electrode 12 and the input electrodes 17a to 17d, a potential difference is applied between the power electrode 15 and the output electrode 16 to measure the current flowing through the semiconductor film 14.

The potential difference between the power electrode 15 and the output electrode 16 is preferably one-fifth times smaller than the voltage applied to the input electrodes 17a to 17d on writing. An example of the potential difference between the power electrode 15 and the output electrode 16 is 0.1 V.

The resistance value is determined depending on the value of the current. Namely, it is determined whether the nonvolatile logic circuit 20 has a high-resistant state or a low-resistant state on the basis of the measured current. As described above, the first and fourth states correspond to the high-resistant state. The second and third states correspond to the low-resistant state.

The high-resistant state and the low-resistant state correspond to false (0) and true (1) of exclusive-OR (XOR) based on the first and second input signals, respectively. Accordingly, the nonvolatile logic circuit 20 serves as exclusive-OR (XOR) circuit.

Example 1

The following example describes the present subject matter in more detail.

(1) A titanium film with a thickness of 5 nm and a platinum film with a thickness of 30 nm were formed in this order on the silicon substrate 1 having silicon oxide thereon using an electron beam deposition method. Furthermore, $SrRuO_3$ (hereinafter, SRO) film with a thickness of 10 nm was formed with a pulse laser deposition method. Thus, the control electrode 12 was formed on the silicon substrate 1.

(2) The substrate was heated to 700° C. The ferroelectric film 13 composed of $Pb(Zr,Ti)O_3$ with a thickness of 450 nm was formed by using a pulsed laser deposition (PLD) method in a PLD chamber.

(3) The temperature of the substrate was set to be 400° C., and the semiconductor film 14 of ZnO with a thickness of 30 nm was formed by the PLD method in the PLD chamber.

(4) The patterns of resist were formed on the semiconductor film 14 with photolithography. Subsequently, the portions of the semiconductor film 14 not to be covered with the resist were removed with etching using nitric acid.

(5) A resist was patterned on the semiconductor film 14 with photolithography. The unnecessary part of the semiconductor film 14 was removed with wet-etching. Subsequently, a resist was patterned on the semiconductor film 14 with photolithography again. A titanium film with a thickness of 5 nm and a platinum film with a thickness of 30 nm were formed with an electron beam deposition method. The resist was removed to form the power electrode 15, output electrode 16, and the input electrodes 17a-17d.

The obtained nonvolatile logic circuit 20 had the input electrodes 17a-17d with 100 micro-meter square, and electrode distance with 10 micro meters. The one state selected from the first to fourth states was written into the nonvolatile logic circuit 20 on the basis of FIG. 4 and FIG. 5. Subsequently, the potential difference of 0.1V between the power electrode 15 and the output electrode 16 was applied to calculate the resistance value of the nonvolatile logic circuit 20 on the basis of the current flowing between the current electrode 15 and the output electrode 16.

Figures 7, 8:
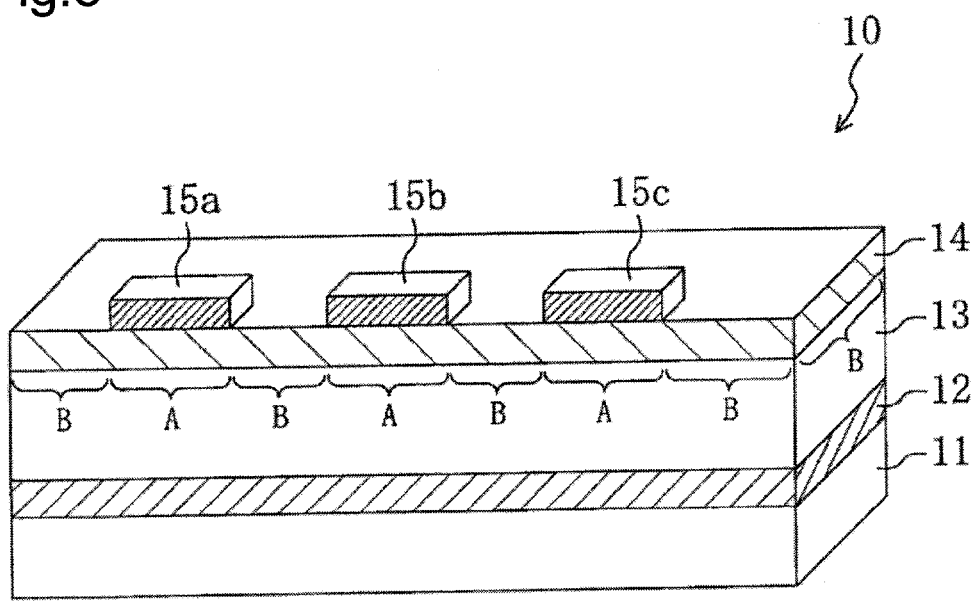
FIG. 7 shows the resistance value calculated in the first to fourth states of the example 1.
FIG. 8 is a reproduction of FIG. 1 of Patent Document 1.
Figure 9A:
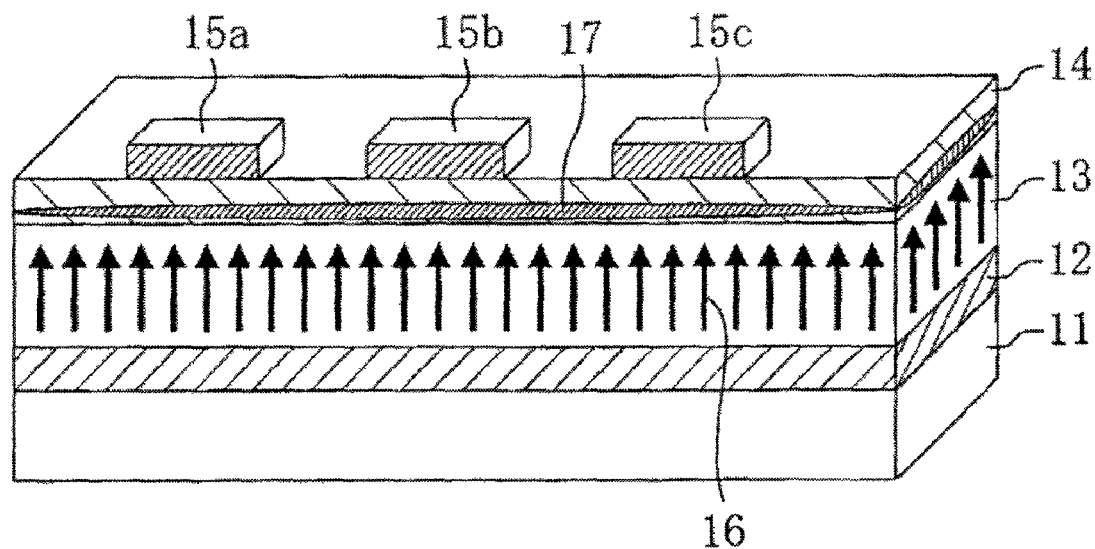
FIGS. 9A and 9B are reproductions of FIG. 2 of Patent Document 1.
Figure 9B:
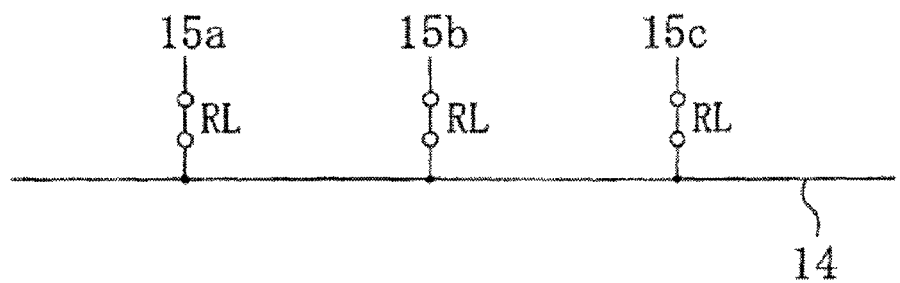
Figure 10A:
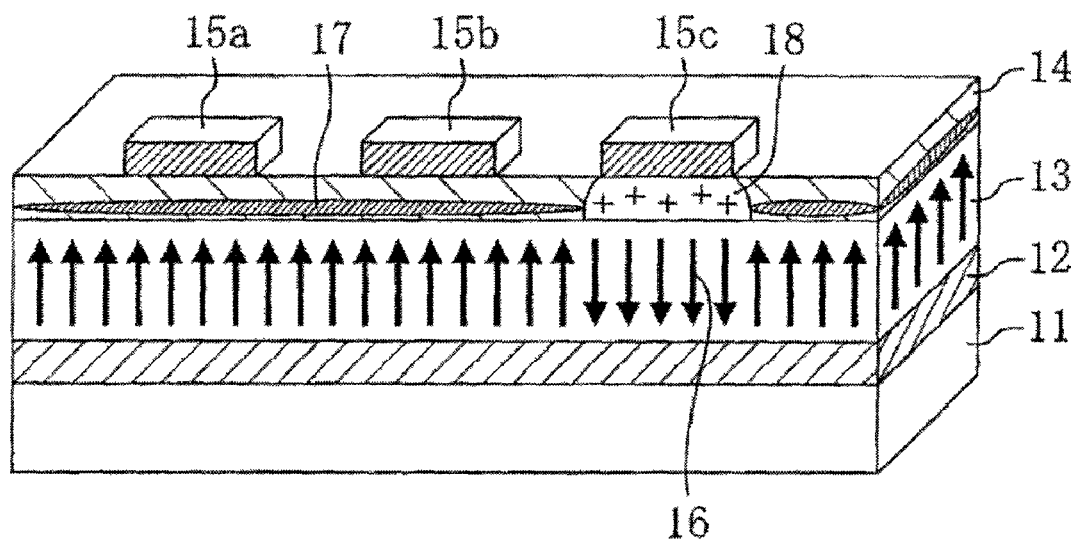
FIGS. 10A and 10B are reproductions of FIG. 3 of Patent Document 1.
Figure 10B:
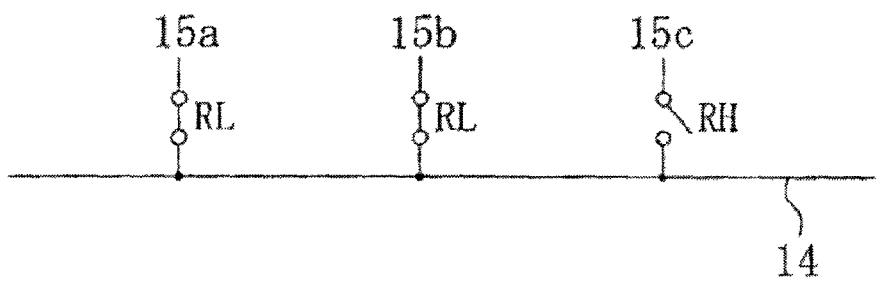

FIG. 7 shows the resistance value calculated in the first to fourth states. As understood from FIG. 7, the nonvolatile logic circuit 20 has high-resistant value in the first or fourth state. On the other hand, the nonvolatile logic circuit 20 has low-resistant value in the second or third state.

In the present example, the control electrode 12 comprised the laminate SRO/Pt/Ti. The electrodes 15 to comprised the laminate Pt/Ti. Other material may be employed.

An example of other material of the ferroelectric film 13 is $Sr(Bi,Ta)O_x$ or $BiTiO_x$. An example of other material of the semiconductor film 14 is GaN or $InGaZnO_x$.

The present disclosure provides a novel method for operating a nonvolatile logic circuit as an exclusive-OR (XOR) circuit.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A method of operating a non-volatile logic circuit, comprising steps of:
    a step (a) of preparing the non-volatile logic circuit, the non-volatile logic circuit comprising:
        a control electrode;
        a ferroelectric layer;
        a semiconductor layer, and
        an electrode group, wherein:
        the control electrode, the ferroelectric layer, the semiconductor layer, and the electrode group are stacked in this order,
        the electrode group comprises an electric current source electrode, an output electrode, a first input electrode, a second input electrode, a third input electrode, and a fourth input electrode,
        an X-direction, a Y-direction, and a Z-direction denote a longitudinal direction of the ferroelectric layer, a direction orthogonal to the longitudinal direction, and a lamination direction, respectively,
        the first input electrode, the second input electrode, the third input electrode, and the fourth input electrode are interposed between the electric current source electrode and the output electrode,
        the first input electrode is interposed between the electric current source electrode and the third input electrode along the X-direction,
        the third input electrode is interposed between the first input electrode and the output electrode along the X-direction,
        the second input electrode is interposed between the electric current source electrode and the fourth input electrode along the X-direction,
        the fourth input electrode is interposed between the second input electrode and the output electrode along the X-direction,
        the first input electrode is adjacent to the second input electrode along the Y-direction, and
        the third input electrode is adjacent to the fourth input electrode along the Y-direction;
    a step (b) of writing one state selected from the group consisting of first, second, third, and fourth states into the non-volatile logic circuit, wherein:
        V1, Va, Vb, Vc, and Vd are voltages applied to the control electrode, the first input electrode, the second input electrode, the third input electrode, and the fourth input electrode, respectively,
        when the first state is written, voltages, which satisfy the following relationship (I), are applied, $V1>Va, V1>Vb, V1<Vc,$ and $V1<Vd$     (I), when the second state is written, voltages, which satisfy the following relationship (II), are applied, $V1<Va, V1>Vb, V1<Vc,$ and $V1>Vd$     (II), when the third state is written, voltages, which satisfy the following relationship (III), are applied, $V1>Va, V1<Vb, V1>Vc,$ and $V1<Vd$     (III), when the fourth state is written, voltages, which satisfy the following relationship (IV), are applied, $V1<Va, V1<Vb, V1>Vc,$ and $V1>Vd$     (IV), the first and fourth states are high resistant states, and the second and third states are low resistant states; and
    a step (c) of measuring a current generated by applying a voltage between the source electrode and the output electrode to determine whether the state written in the non-volatile logic circuit is the high or low resistant state on the basis of the current.

2. The method of claim 1, further comprising, between the step (a) and the step (b):
    a step (d) of applying a voltage Vin to the first, second, third, and fourth input electrodes and a voltage Vreset, where Vreset>Vin, to the control electrode to reset the non-volatile logic circuit.

3. The method of claim 1, wherein, in the step (b),
    a first input signal which is either true or false is input to the first input electrode,
    a second input signal which is either true or false is input to the second input electrode,
    an inversion signal of the second input signal is input to the third input electrode,
    an inversion signal of the first input signal is input to the fourth input electrode, and
    the high and low resistant states correspond respectively to false and true of exclusive OR on the basis of the first and second input signals.

4. The method of claim 1, further comprising, between the step (b) and the step (c):
    a step of (e) of turning off power supplied to the non-volatile logic circuit.

* * * * *